United States Patent
Sizov et al.

(10) Patent No.: US 12,331,426 B2
(45) Date of Patent: Jun. 17, 2025

(54) SUBSTRATES FOR III-NITRIDE EPITAXY

(71) Applicants: Victor Sizov, Dresden (DE); Karl-Heinz Stegemann, Dresden (DE); Ronny Mueller-Biedermann, Dresden (DE); Thomas Lindner, Dresden (DE)

(72) Inventors: Victor Sizov, Dresden (DE); Karl-Heinz Stegemann, Dresden (DE); Ronny Mueller-Biedermann, Dresden (DE); Thomas Lindner, Dresden (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 458 days.

(21) Appl. No.: 17/411,851

(22) Filed: Aug. 25, 2021

(65) Prior Publication Data

US 2021/0381126 A1    Dec. 9, 2021

Related U.S. Application Data

(62) Division of application No. 16/448,178, filed on Jun. 21, 2019, now abandoned.

(30) Foreign Application Priority Data

Jun. 22, 2018 (GB) .................. 1810251

(51) Int. Cl.
- *C30B 25/18* (2006.01)
- *C30B 29/40* (2006.01)
- *H01L 21/02* (2006.01)

(52) U.S. Cl.
CPC .......... *C30B 25/186* (2013.01); *C30B 25/183* (2013.01); *C30B 29/406* (2013.01);
(Continued)

(58) Field of Classification Search
CPC ... C30B 25/183; C30B 25/186; C30B 29/406; H01L 21/02323; H01L 21/02381;
(Continued)

(56) References Cited

U.S. PATENT DOCUMENTS

| 4,376,657 A | 3/1983 | Nagasawa et al. |
| 4,548,654 A | 10/1985 | Tobin |

(Continued)

FOREIGN PATENT DOCUMENTS

| EP | 0066461 A2 | 12/1982 |
| EP | 2945185 | 11/2015 |

(Continued)

OTHER PUBLICATIONS

Intellectual Property Office, Examination Report Under Section 18(3), United Kingdom Patent Application No. GB1810251.7, 4 pages, Aug. 20, 2021.

(Continued)

*Primary Examiner* — Hua Qi
(74) *Attorney, Agent, or Firm* — Thompson Hine LLP

(57) ABSTRACT

A wafer suitable for epitaxial growth of gallium nitride (GaN) in a Metal Oxide Chemical Vapor Deposition (MOCVD) process. The wafer includes a silicon substrate having a front side and a back side and an edge extending between the front side and the back side, the edge including a front bevel surface connected to the front side and a back bevel surface connected to the back side, wherein the silicon substrate comprises an oxygen denuded silicon layer surrounding a core. The wafer further includes a protection layer being a thermally grown silicon oxide ($SiO_2$) layer substantially covering the front bevel surface and the back bevel surface of the edge, while leaving at least a central region of the front side of the silicon substrate exposed, for preventing meltback during the MOCVD process.

7 Claims, 11 Drawing Sheets

(52) U.S. Cl.
CPC .. *H01L 21/02323* (2013.01); *H01L 21/02381* (2013.01); *H01L 21/02458* (2013.01); *H01L 21/0254* (2013.01); *H01L 21/0262* (2013.01); *H01L 21/02639* (2013.01); *H01L 21/02645* (2013.01)

(58) Field of Classification Search
CPC ........... H01L 21/02458; H01L 21/0254; H01L 21/0262; H01L 21/02639; H01L 21/02645
See application file for complete search history.

(56) References Cited

U.S. PATENT DOCUMENTS

| | | | |
|---|---|---|---|
| 9,006,865 B2 | 4/2015 | Ikuta et al. | |
| 2002/0179006 A1* | 12/2002 | Borgini | H01L 21/3225 257/E21.321 |
| 2003/0181020 A1* | 9/2003 | Ishitsuka | H01L 21/76232 438/424 |
| 2004/0005777 A1 | 1/2004 | Qu et al. | |
| 2007/0281488 A1* | 12/2007 | Wells | H01L 21/3065 438/705 |
| 2012/0282766 A1 | 11/2012 | Fischer et al. | |
| 2013/0029475 A1* | 1/2013 | Tsukamoto | H01L 21/02236 438/459 |
| 2015/0017790 A1 | 1/2015 | Yamamoto | |
| 2015/0357200 A1* | 12/2015 | Inui | H01L 21/31144 438/706 |
| 2015/0371865 A1* | 12/2015 | Chen | H01L 21/31116 438/715 |

FOREIGN PATENT DOCUMENTS

| | | | |
|---|---|---|---|
| WO | 02/03445 A1 | 1/2002 | |
| WO | 2010/050120 A1 | 5/2010 | |
| WO | 2017/171755 | 10/2017 | |
| WO | WO-2017171755 A1 * | 10/2017 | ....... H01L 21/02381 |

OTHER PUBLICATIONS

United Kingdom Intellectual Property Office, Examination Report under Section 18(3), Application No. GB1810251.7, 4 pages, Feb. 18, 2022.

GB, Combined Search and Examination Report under Sections 17 and 18(3); Patent Application No. GB1810251.7; 6 pages (Dec. 21, 2018).

* cited by examiner

SUBSTRATES FOR III-NITRIDE EPITAXY

This application is a divisional of U.S. patent application Ser. No. 16/448,178 filed on Jun. 21, 2019, which in turn claims priority to UK Patent Application No. 1810251.7 filed on Jun. 22, 2018. The entire contents of both applications are hereby incorporated by reference.

TECHNICAL FIELD

The disclosure relates to substrates for group-III nitride epitaxy and processes for preparing such substrates.

BACKGROUND

Group-III nitride semiconductors, such as gallium nitride, have a relatively wide band gap and are used to make light emitting diodes (LEDs) and power devices. The semiconductors can be manufactured by epitaxial growth on a silicon substrate, for example in a Metal Oxide Chemical Vapor Deposition (MOCVD) process.

The typical temperature of a group-III nitride MOCVD process is in the range of 1000° C. to 1200° C. At such high temperatures the reaction between Si and Ga becomes very strong and causes so called "Melt Back Etching" (MBE), which is a known problem for GaN on Si technology. The presence of MBE defects can significantly limit the epitaxy (EPI) process yield and the EPI process window. To avoid this issue, a Ga free protection layer, such as aluminium nitride (AlN), can be deposited during epitaxy before starting the GaN growth. However, the area near the substrate bevel (i.e. the edge of the substrate) and the bevelled region itself cannot be completely protected, and MBE will usually occur there. The Si crystal orientation at the bevel is different to that of the flat substrate surface, which prevents continuous growth of AlN and results in access of Si by Ga during epitaxy. Another mechanism causing MBE is the formation of small cracks in the EPI layer during growth, which provides openings to the Si.

EP 2 945 185 A1 describes the use of an edge-mask layer to cover the bevel. Two processes for making this edge-mask layer are described. One is a lift off process of the deposited edge-mask layer, to keep it only near the wafer bevel. The other is a direct etch at the centre to achieve the same result. Both processes require one to one expose capability, which may not be available for big diameter substrates and may increase the manufacturing cost.

U.S. Pat. No. 9,006,865 describes roughening the substrate at the wafer edge, to prevent the EPI layers from cracking during epitaxy. The roughened substrate surface stimulates polycrystalline growth of group-III nitrides, and hence releases mismatch stress which is the root cause of the cracking.

U.S. Patent Application Publication No. 2015/0017790 describes the use of an asymmetrical bevel shape. The shape provides a reduced area of the bevel with different crystal orientation, which gives better AlN coverage. This approach requires custom processing of the substrate at the substrate vendor or another external service, which may increase manufacturing costs.

SUMMARY

Aspects of the present invention provide wafers suitable for epitaxial growth of a group-III nitride semiconductor and methods of preparing such wafers as set out in the accompanying claims.

Certain embodiments of the invention are described below, by way of example only, with reference to the accompanying drawings.

DETAILED DESCRIPTION

The disclosed embodiments relate to substrate preparation prior to group-III nitride (e.g. AlN, InN or GaN or their alloy (AlGaN or InGaN for example)) on silicon (Si) epitaxy. The embodiments may solve at least some of the above mentioned issues of the prior solutions to Melt Back Etching (MBE), and may solve further, previously unanticipated, problems. The embodiments can provide substrate bevel protection in order to suppress MBE during group-III nitride MOCVD processes. The substrate bevel protection can significantly improve EPI wafer yield and the size of the EPI process window.

Figure 1A:
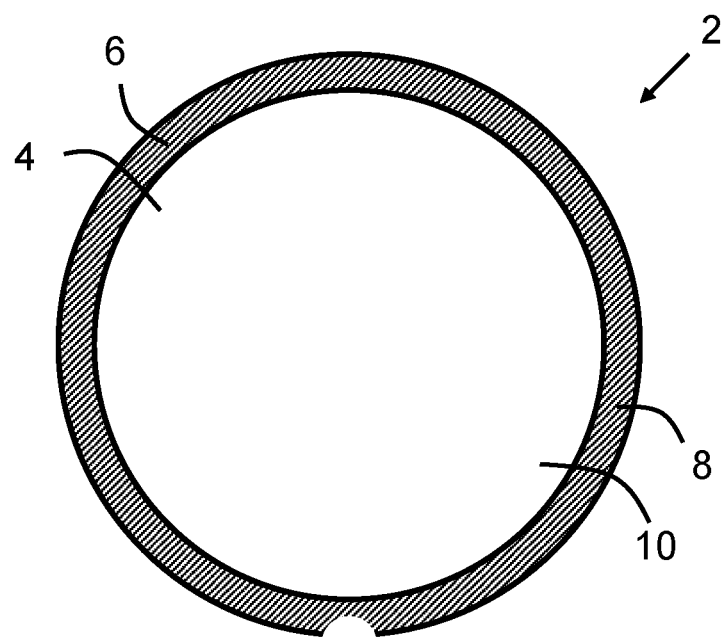
FIG. 1a is a top view of a Si wafer according to an embodiment.
Figure 1B:
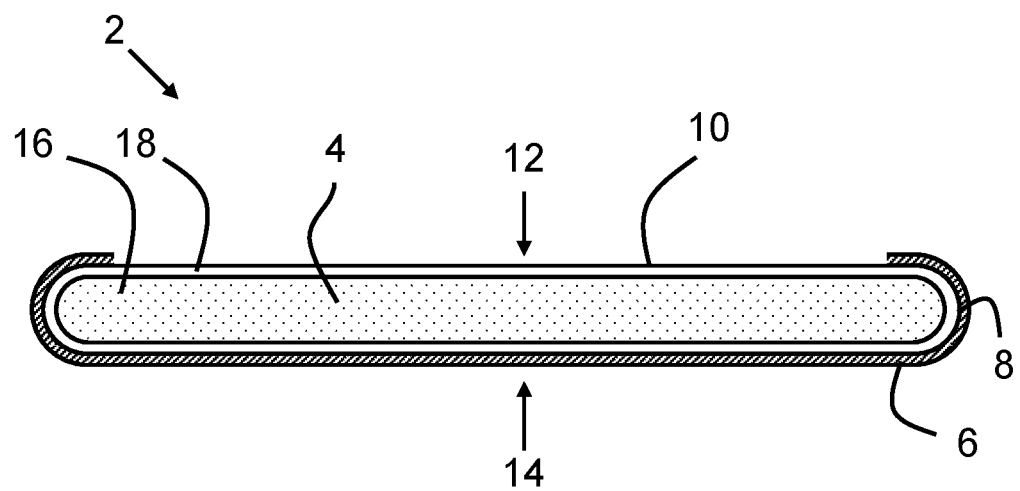
FIG. 1b is a side cross-sectional view of a Si wafer according to the embodiment.

FIGS. 1a and 1b illustrate a wafer 2 suitable for epitaxial growth of GaN according to an embodiment. FIG. 1a is a top view of the wafer 2 comprising a silicon substrate 4 and a protection layer 6 (e.g. an oxide layer). The protection layer 6 covers the edge 8 of the substrate 4, such that only a central region 10 of the front side 12 of the substrate 4 is exposed. FIG. 1b is a side cross-sectional view of the wafer 2. The oxide layer 6 covers the edge 8 and the back side 14 of the wafer. The silicon substrate 4 comprises a core 16 and a surrounding oxygen denuded silicon layer 18 (also referred to simply as "denuded layer" 18). The protection layer 6 does not cover the central region 10 of the front side 12, such that the denuded layer 18 in this region 10 is exposed. A group-III nitride semiconductor can be grown on the denuded silicon layer 18 in the central region 10. For example, a buffer layer comprising AlN can be grown in the central region 10 followed by GaN.

The buffer layer can be a layer comprising one of aluminium nitride, AlN, indium nitride, InN, aluminium gallium nitride, AlGaN, indium aluminium nitride, InAlN, and indium aluminium gallium nitride, InAlGaN, or can be formed from a stack of layers formed from any combination of these materials.

A drawback of some prior solutions is that they do not cover the back side of the bevelled edge or the back side of the substrate. This means that formation of MBE is still possible at the back side of the bevel, where Ga can reach Si for some growth conditions. Also, by not protecting the back side of the substrate, it can be contaminated by the platter (i.e. the wafer holder inside of EPI reactor) leading to future cross contamination risk. The embodiment illustrated in FIGS. 1a and 1b solves this problem by providing a protection layer 6, which covers the whole edge 8 (i.e. front and back of the bevelled edge 8) and the back side 14 of the substrate.

Figure 2:
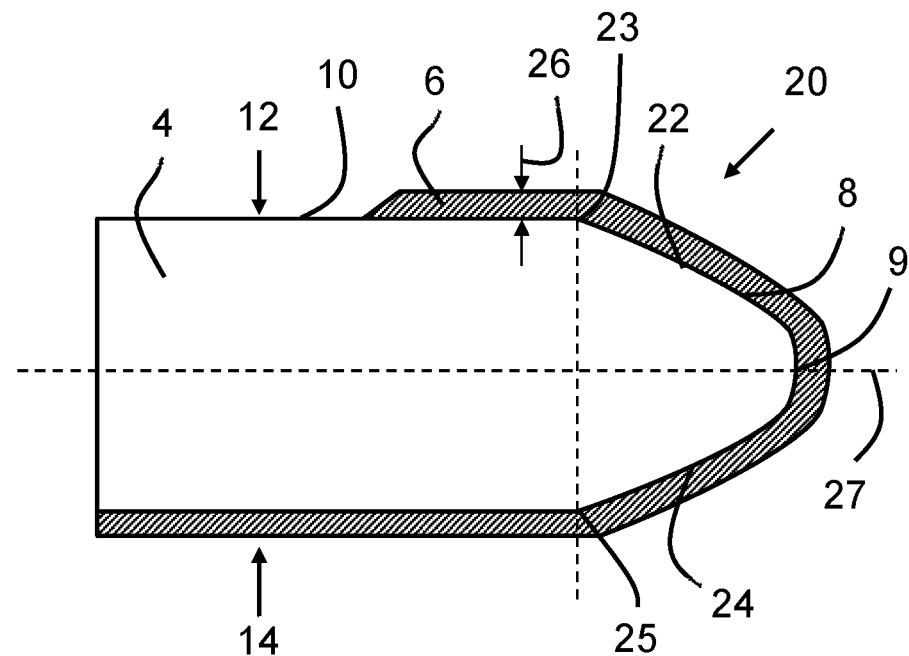
FIG. 2 is a side cross-sectional view of a portion of a wafer according to an embodiment.

FIG. 2 shows an edge portion 20 of the wafer 2 according to an embodiment. The edge 8 of the substrate 4 comprises a front bevel surface 22 connected to the front side 12 of the substrate 4, and a back bevel surface 24 connected to the back side 14 of the substrate 4. The protection layer 6 (e.g. an oxide layer) covers the whole edge 8, including the front bevel surface 22 and the back bevel surface 24. The front bevel surface 22 is defined herein as the surface of the silicon substrate 4 extending from the curve 23 (adjacent the front side 12 of the substrate 4 where the substrate starts to curve/angle downwards) to the outermost edge 9. The back bevel surface is similarly defined herein as the surface extending from the curve 25 (adjacent the back side 14 of the substrate 4 where the substrate starts to curve/angle upwards) to the outermost edge 9. Accordingly, if the edge 8 is symmetrical, the front bevel surface 22 meets the back bevel surface 24 along the mid-plane 27 of the substrate 4. The protection layer 6 extends a small distance from the edge 8 onto the front side 12 of the substrate 4, such that only a central region 10 of the front side 12 is exposed. Also the back side 14 of the substrate 4 is covered by the protection layer 6, such that only the central region 10 on the front side 12 of the substrate 4 is exposed. The protection layer 6 has a thickness 26, which may vary along the edge 8. The protection layer 6 may have a thickness greater than 100 nm, for example in the range of 100 nm to 1000 nm, and more specifically in one case in the range of 200 nm to 600 nm. The protection layer 6 can have a thickness smaller than the thickness of the EPI layer (e.g. the GaN layer) to be grown.

An additional disadvantage of a prior system (see e.g. U.S. Patent Application Publication No. 2015/0017790) is that the oxide thickness has to be greater than the group-III nitride thickness (for reasons not stated in U.S. 2015/0017790), which can make the thermal oxidization process too long leading to a high risk of degradation of the mechanical properties of the substrate. In the prior system, the protective layer at the bevel then has to be removed after the EPI process (for reasons not stated in U.S. 2015/0017790) which requires additional process steps. Embodiments described herein can have a thinner oxide layer as a result of the improved substrate preparation process, which does not require additional process steps to remove the protective layer after the EPI process.

Another aspect which has to be considered is substrate annealing and other thermal treatments at the beginning of the GaN on Si EPI process. To start the epitaxy growth processes, the native $SiO_2$ has to be removed. Historically, a wet process was adopted for this purpose, but nowadays in-situ pre-EPI substrate annealing in a hydrogen-containing atmosphere is more common. The pre-EPI substrate annealing has the advantage of reduced wafer handling, better particle contamination control, and there is no need for wet equipment. A drawback of this approach is that the in-situ annealing process has a relatively narrow process window, and it is very sensitive to the EPI reactor precondition. The reason is that native $SiO_2$ annealing typically occurs at 1000° C. to 1100° C., where oxygen precipitation formation in the Si substrate is very efficient. The precipitation centres attract contamination from the duty EPI reactor environment and can significantly damage substrate surface quality. Degradation of the substrate quality leads to an increase of the crystal micro and macro defects in the grown group-III nitride or even MBE formation if the macro defects are big enough to support Ga access to the Si. The described pre-EPI substrate preparation provides the oxygen denuded Si layer near the substrate surface, which creates an oxygen precipitation free surface during the initial thermal treatment steps of the GaN on Si EPI process and can hence make the overall EPI process more stable. Uncontrolled oxygen precipitation in the depth of the Si substrate during EPI growth (which is 6 to 8 hours or longer at a temperature of about 1100° C.) may lead to a significant change in the mechanical properties of the Si substrate and lead to strain management failure.

Figure 3:
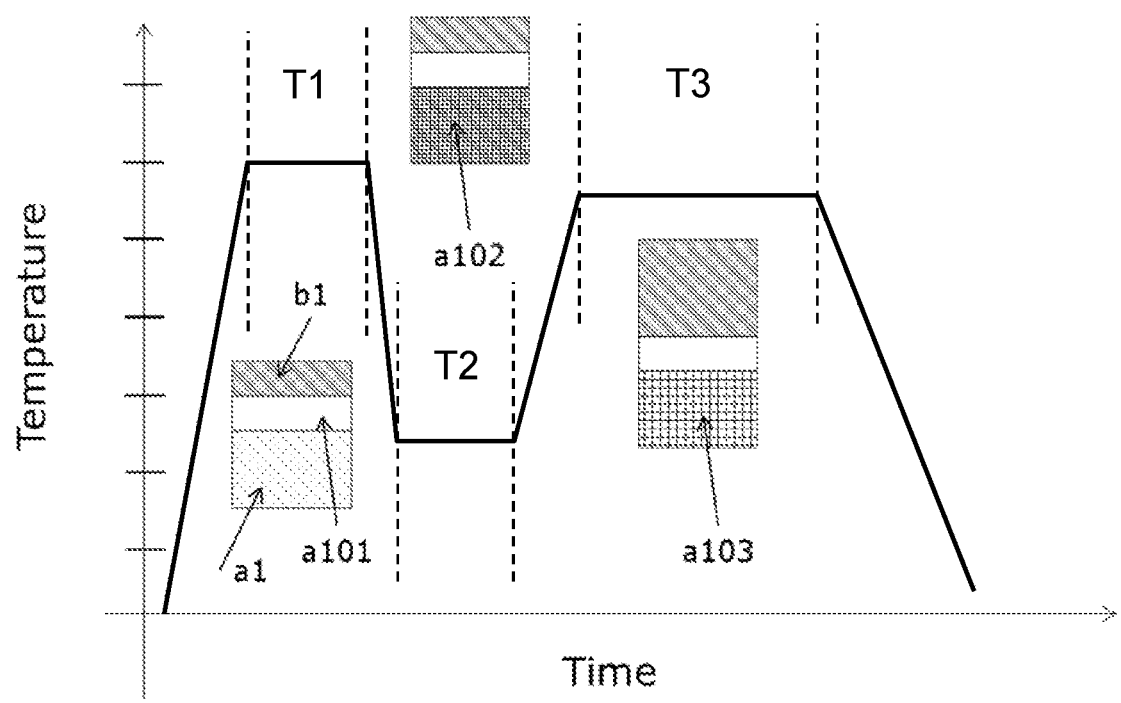
FIG. 3 is a diagram showing temperature plotted against time for a wafer preparation process according to an embodiment.

The substrate preparation process according to an embodiment can be divided into three main stages as illustrated in FIG. 3. FIG. 3 shows a temperature profile used to provide "intrinsic gettering" in the silicon. Gettering is a process in which contaminants are moved away from the surface of a semiconductor and into the bulk (core) where they are trapped, thereby creating a denuded zone at the surface.

The first step (T1, Out-diffusion): The first oxidation and subsequent annealing. The first oxidation is performed in an oxygen containing atmosphere at temperature of about 1000° C. to achieve an oxide layer thickness of about 10 nm to 60 nm. The purpose of this oxide layer b1 is to generate an oxygen denuded Si layer a101 and to protect the Si surface during further process steps. During oxidation in a diluted or pure oxygen atmosphere, an intrinsic interstitial oxide (Oi) in silicon diffuses to the surface and a denuded zone a101 (i.e. the oxygen denuded silicon layer) is formed. Depending on the oxidation and annealing time, the denuded zone a101 may be between 10 μm and 30 μm thick, or between 5 μm and 50 μm thick. The target thickness and the oxidation conditions are selected so as to avoid precipitation formation inside the denuded zone a101, and so that only very small nucleation seeds in the substrate core al (under the denuded zone) are possible. It is necessary to create a denuded layer a101 and enough oxide thickness to provide sufficient Si surface protection. Subsequent annealing is performed in an oxygen free atmosphere (for example in N or Ar) to improve the $SiO_2$/Si interface quality and to cause further $O_2$ out-diffusion.

The second step (T2, Nucleation): Formation of the precipitation seeds. During this step precipitation seeds a102 are formed in the core of the Si substrate (but not in the denuded silicon layer). The core may have a precipitation size of 2 nm to 20 nm, for example. This step can be performed specifically for the purpose of nucleation (e.g. with a ramp-down phase from 1000° C. to between 600° C. and 800° C., and a following cool down phase at this temperature), or it can be a side effect of another required treatment, for example Low Pressure Chemical Vapor Deposition (LPCVD) silicon nitride (SiN) hard mask deposition. For LPCVD SiN deposition a temperature lower than the oxidation temperature is used (e.g. between 650° C. and 800° C. for more than 30 min).

The third step (T3, Precipitation a103 growth): The second (main) oxidation. The oxide grown in this step (e.g. oxide layer 6 in FIGS. 1a, 1b and 2) provides protection for the substrate bevel. The thickness of this oxide should be about 100 nm to 500 nm. The lower limit (about 100 nm) is set such that there is sufficient thickness to continuously cover the wafer bevel throughout the remaining EPI process steps. The upper limit (about 500 nm) depends on the thermal budget and process time limit. The oxidation conditions (time, temperature, atmosphere and annealing after oxidation) can be selected according to substrate type (e.g. in terms of doping, oxygen content, crystal orientation and epitaxy temperature) in order to have proper precipitation (greater than about 2 nm to 5 nm, to be stable up to 1100° C. epitaxy). If the mechanical properties of the substrate are required to remain unchanged, the precipitation size should be small enough to tend to dissolve at the group-III nitride EPI growth temperature. If there is a need to make the substrate less brittle, a bigger size of precipitation a103 can be used. Uncontrolled precipitation growth can lead to significant change of the substrate's mechanical properties and loss of the wafer strain management control.

Figure 4A:
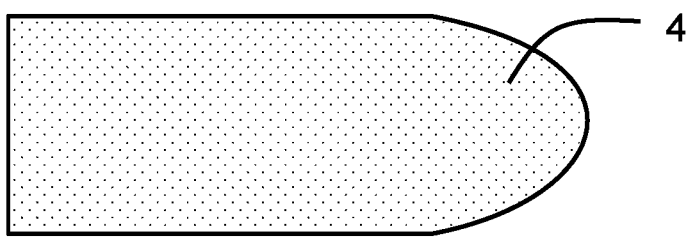
FIGS. 4A, 4B, 4C, 4D, 4E, 4F, 4G, 4H, 4I, 4J, 4K, 4L, 4M, 4N, 4O, 4P, 4Q, 4R and 4S are a series of schematic diagrams illustrating processes of wafer preparation according to embodiments.
Figure 4B:
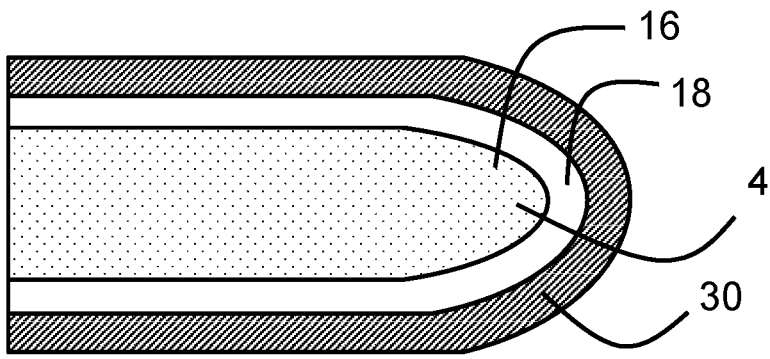
Figure 4C:
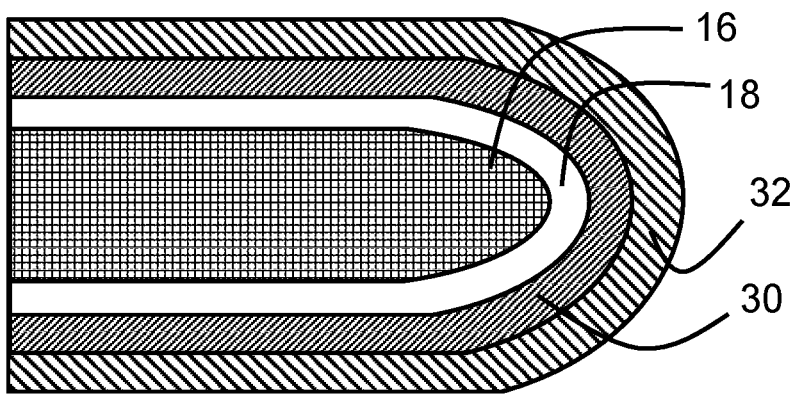
Figure 4D:
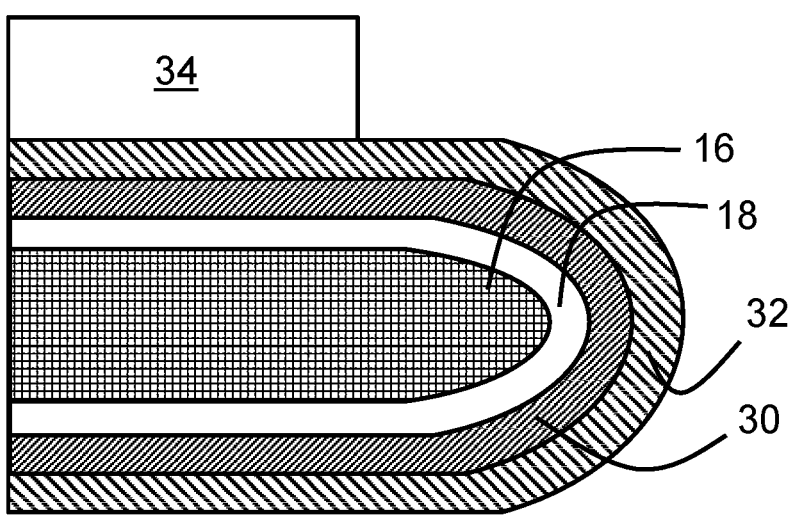
Figure 4E:
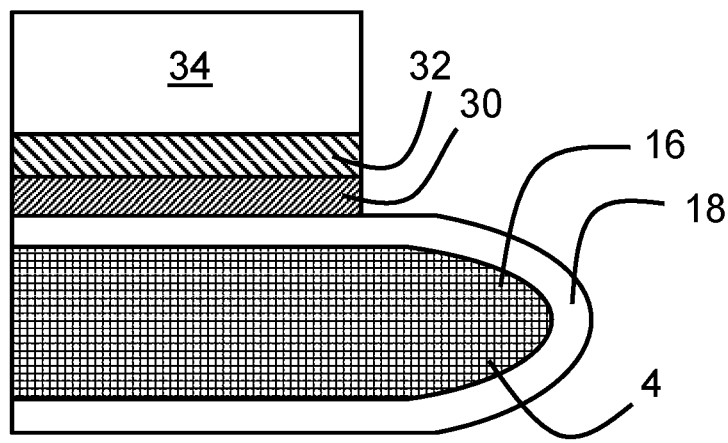
Figure 4F:
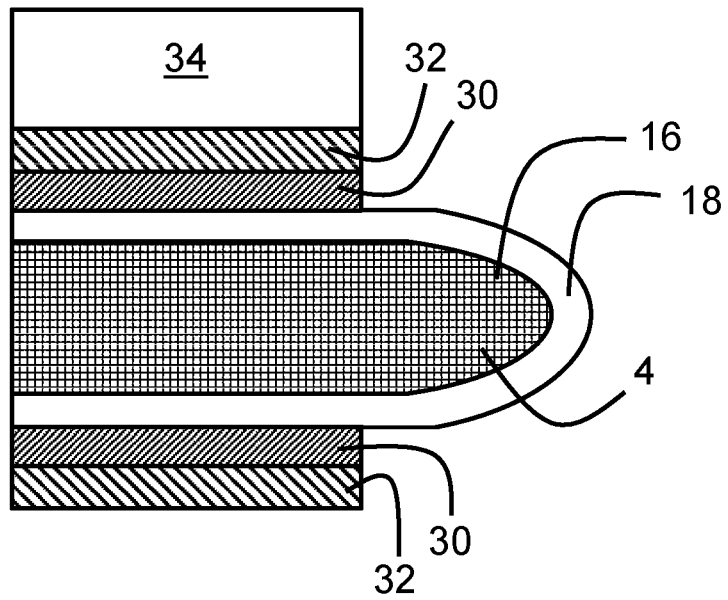
Figure 4G:
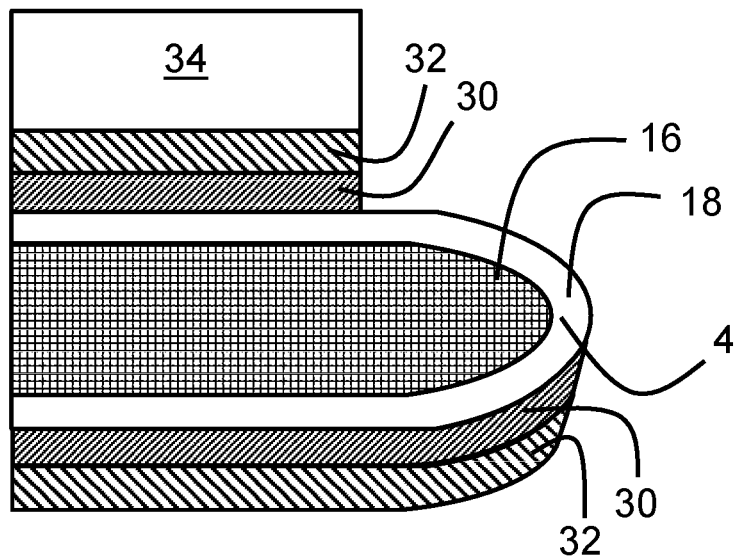
Figure 4H:
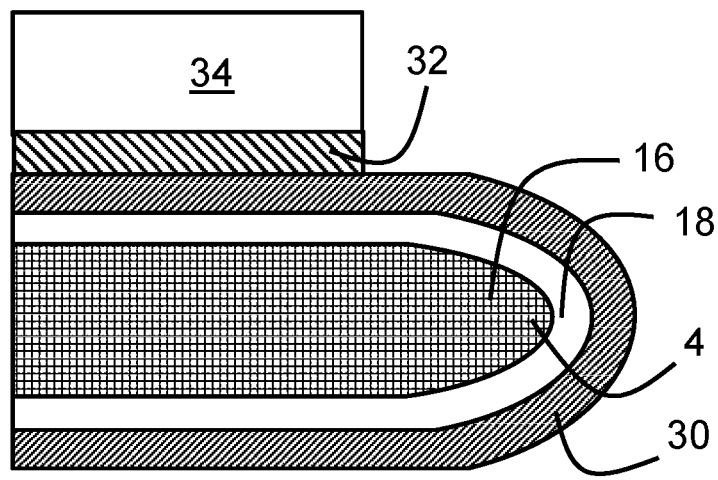
Figure 4I:
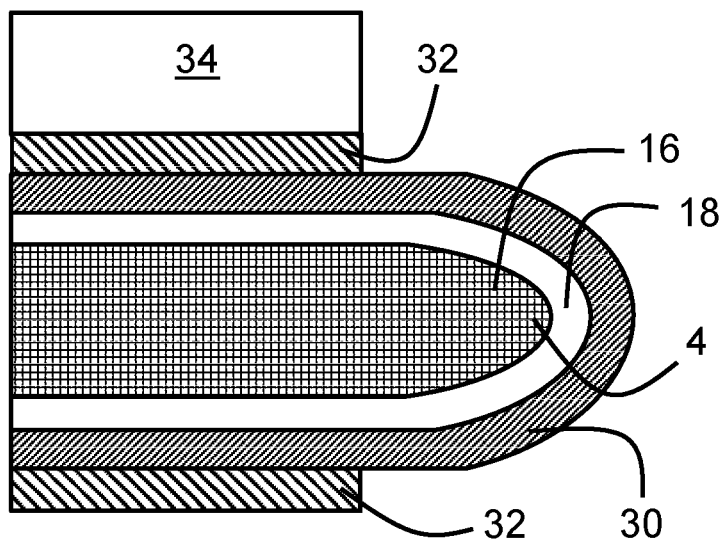
Figure 4J:
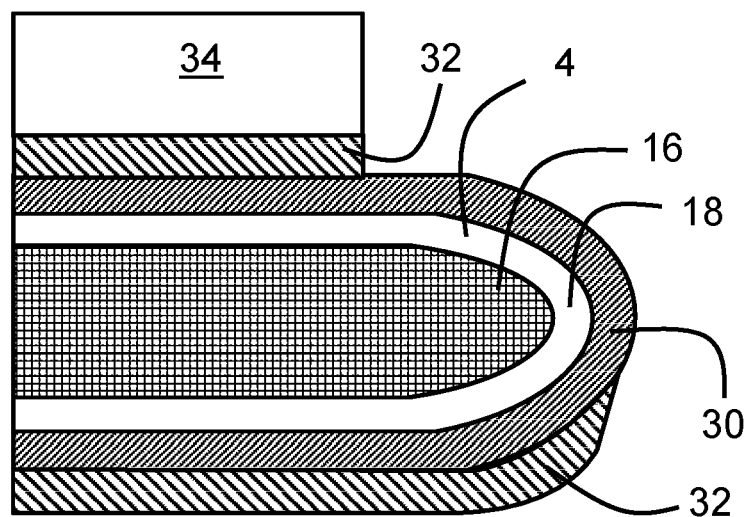
Figure 4K:
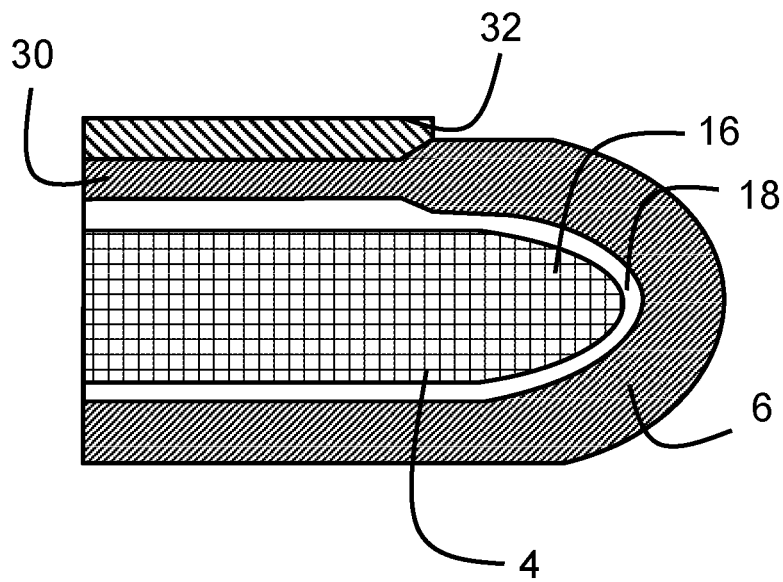
Figure 4L:
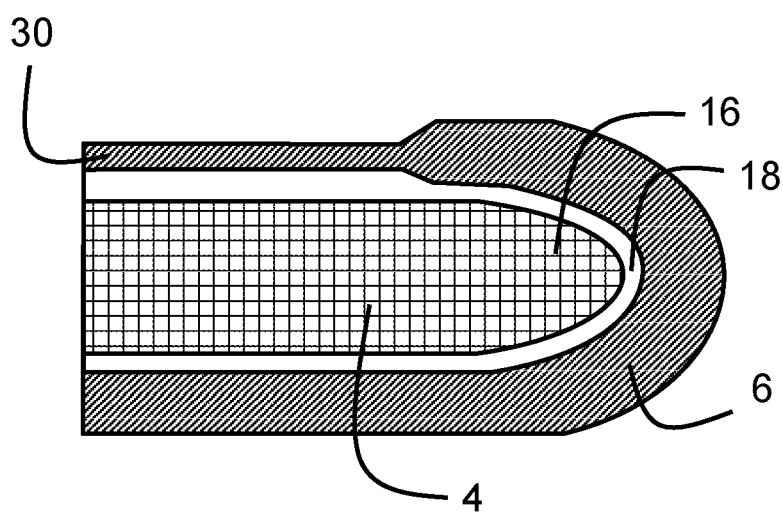
Figure 4M:
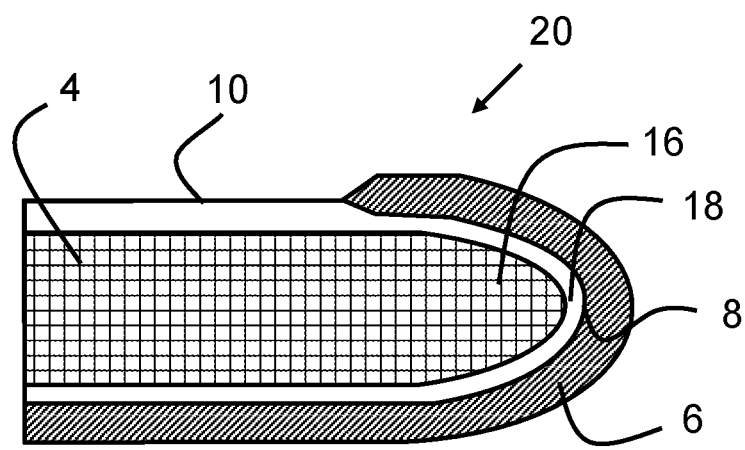
Figure 4N:
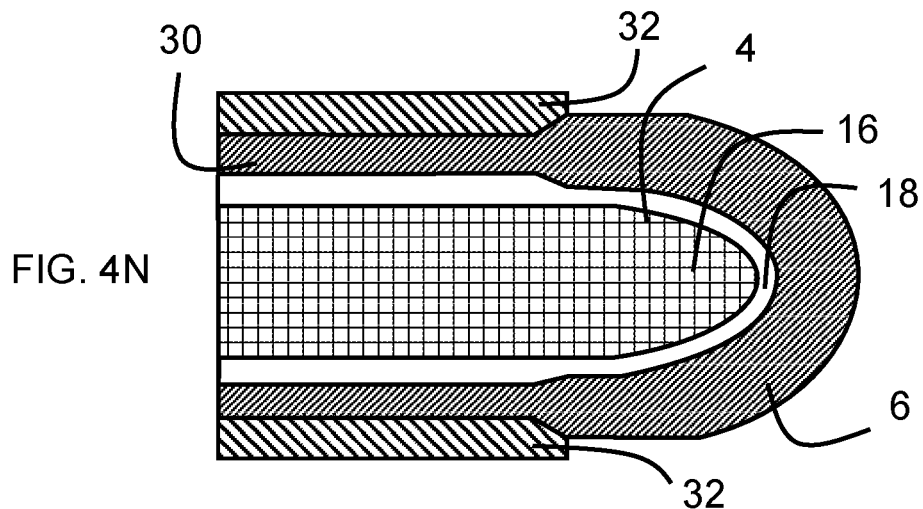
Figure 4O:
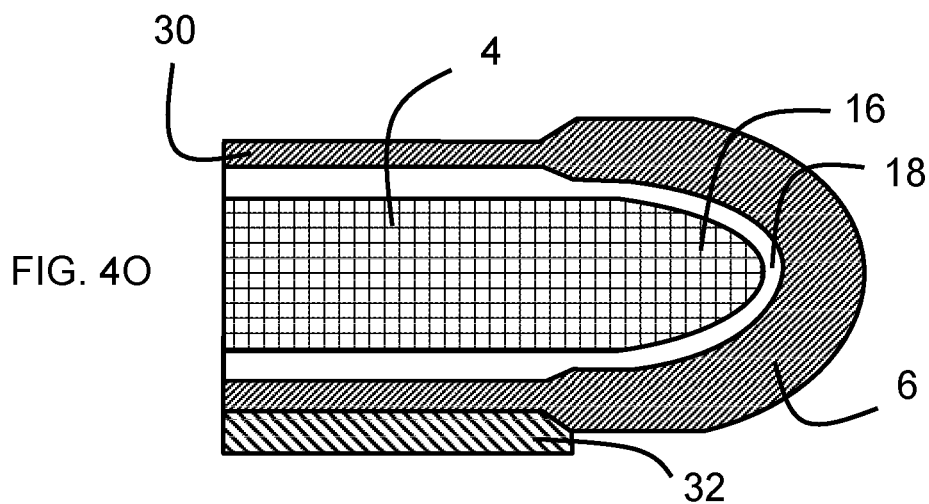
Figure 4P:
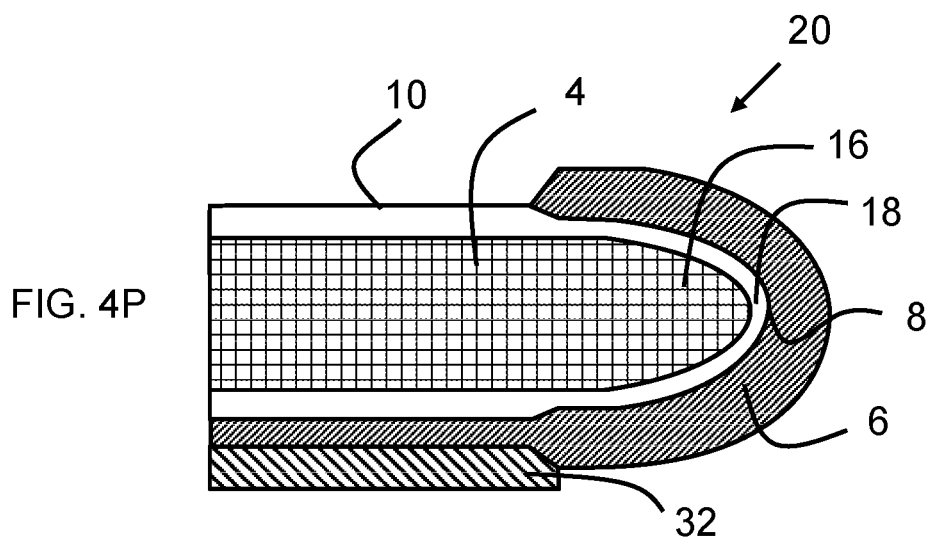
Figure 4Q:
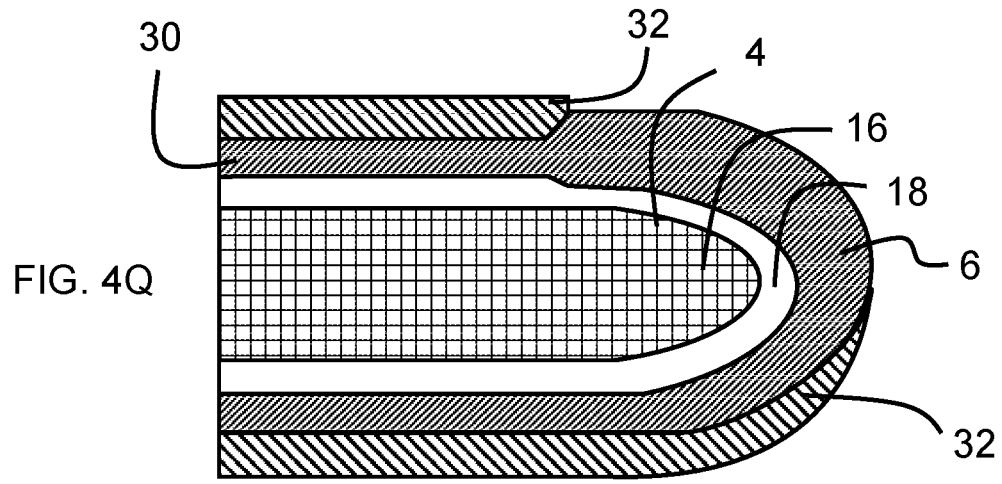
Figure 4R:
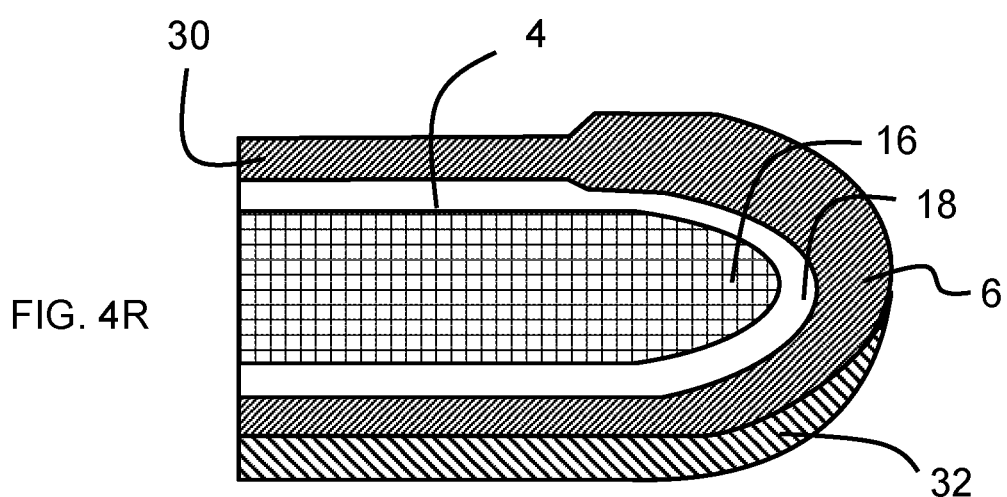
Figure 4S:
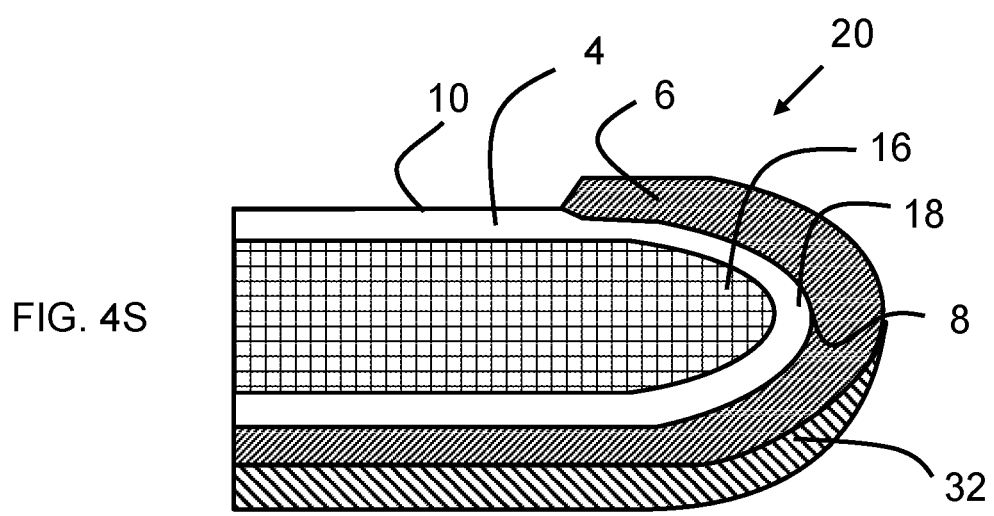

FIGS. 4A-4S illustrate different processes for making a wafer using a positive resist according to an embodiment. FIGS. 4A-4S illustrate separate steps labelled A to S, and each step is described below. To aid understanding, features of the wafer in FIGS. 4A-4S similar to those in FIGS. 1a and 1b have been given the same reference numerals, but the wafer produced by a process illustrated in FIGS. 4A-4S is not limited to the wafer of FIGS. 1a and 1b.

FIG. 4A The process starts with a bare silicon substrate 4.

FIG. 4B A first oxidation and annealing is performed to form a first oxide layer 30 and to generate a denuded layer 18 around a core 16 of the silicon substrate 4. The first oxide layer 30 is relatively thin and has a thickness in the range of 10 nm to 60 nm. The oxide growth is followed by annealing in the oxygen free atmosphere at a similar temperature causing the denuded zone 18 to grow further.

FIG. 4C A thin (about 10 nm to 100 nm) silicon nitride (SiN) layer 32 is deposited. The SiN layer 32 will be used as a hard mask at a later stage.

FIG. 4D The wafer is coated with resist 34. After resist coating the wafer, edge light exposure is performed directly in the resist coating tool. This allows the process to be carried out without the need for a stepper tool (which is generally expensive). The resist 34 is developed to expose the underlying SiN layer 32 around the edge of the substrate 4.

FIG. 4E to FIG. 4J After the resist development, a SiN etch is performed to form a SiN hard mask 32. Each step of FIG. 4E to FIG. 4J illustrates a different result of performing the SiN etch, wherein the difference depends on the available equipment and other requirements. In all cases, the central region on the front side of the substrate stays covered by the SiN hard mask 32.

FIG. 4E and FIG. 4H When the selected etch conditions are close to perfectly isotropic, the SiN 32 (or SiN 32 and oxide layer 30) will be etched at the back side of the bevel and even on the back side of the substrate 4.

FIG. 4G and FIG. 4J In the case where anisotropic etching dominates, the SiN 32 (or SiN 32 and oxide layer 30) will only be etched on the front side of the wafer and bevel. The back side of the wafer is still covered by SiN.

FIG. 4F and FIG. 4I In an intermediate case, the SiN 32 (or SiN 32 and oxide layer 30) are etched on the front side and the back side of the bevel edge but not on the back side of the substrate 4.

FIG. 4K, FIG. 4N and FIG. 4Q The resist 34 is stripped away. After the resist strip, a second oxidation is performed to form a second oxide layer 6 (which will become the protection later). Depending on the process requirements, this second oxide thickness may vary from 150 nm to 600 nm, but needs to be at least thick enough to provide sufficient bevel protection. When designing the second oxide thickness, the consumption of oxide 6 at the bevel during the subsequent steps of SiN hard mask removal and oxide etching has to be considered. Due to the presence of the SiN hard mask 32, the oxide 6 will only grow in the area where SiN was previously removed. Also, precipitation growth, out of denuded layer 18, occurs in the silicon substrate core 16. For clarity, the step of FIG. 4K follows from either FIG. 4E or FIG. 4H, the step of FIG. 4N follows from either FIG. 4F or FIG. 4I, and step FIG. 4Q follows from either FIG. 4G or FIG. 4J.

FIG. 4L, FIG. 4O and FIG. 4R After the second oxidation, the SiN hard mask 32 is removed. This will generally also reduce the thickness of the oxide layer 6 by a small amount. Group-III nitride epitaxy processes are very sensitive to the Si surface quality, and the SiN etch has to be stopped at the first oxide 30 to avoid Si damage.

FIG. 4M, FIG. 4P and FIG. 4S The oxide layer 30 in the central region 10 of the substrate 4 is removed. For example, a diluted HF (hydrofluoric acid) or buffered HF (BOE) oxide etch step is carried out to completely remove the underlying thin oxide layer 30.

FIG. 5 shows an alternative embodiment, in which a negative resist is used. The use of a negative resist removes the need for a SiN hard mask. FIG. 5 is divided into 5 steps, labelled A to E, illustrating the process.

Figure 5A:
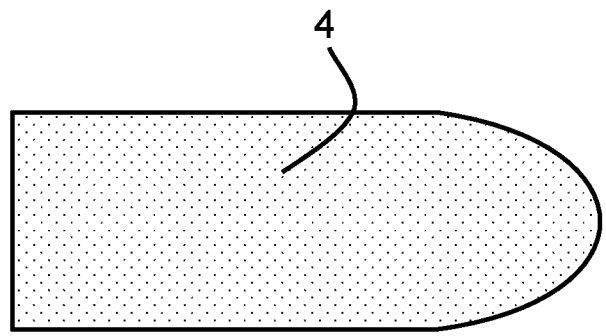
FIGS. 5A, 5B, 5C, 5D and 5E are a series of schematic diagrams illustrating a process of wafer preparation according to another embodiment.

FIG. 5A A bare Si substrate 4 is provided.

Figure 5B:
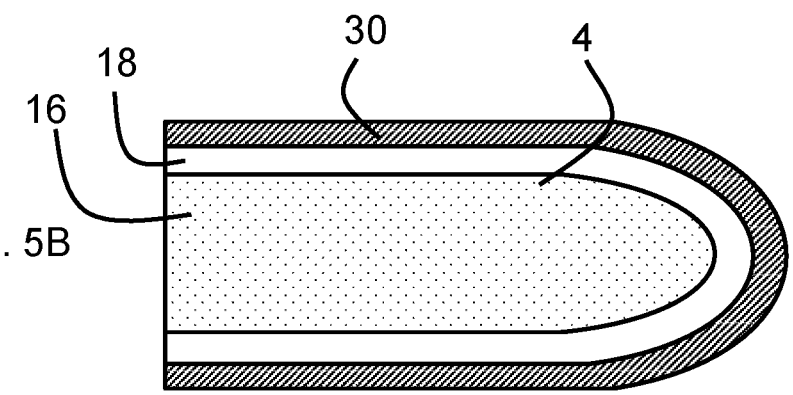

FIG. 5B First oxidation to form first oxide layer 30 is performed. Annealing generates a denuded Si layer 18 around the core 16, and in-situ seed formation in the core 16 after ramp-down to between 650° C. and 800° C. under N2. The time for seed formation is typically 2 to 4 hours.

Figure 5C:
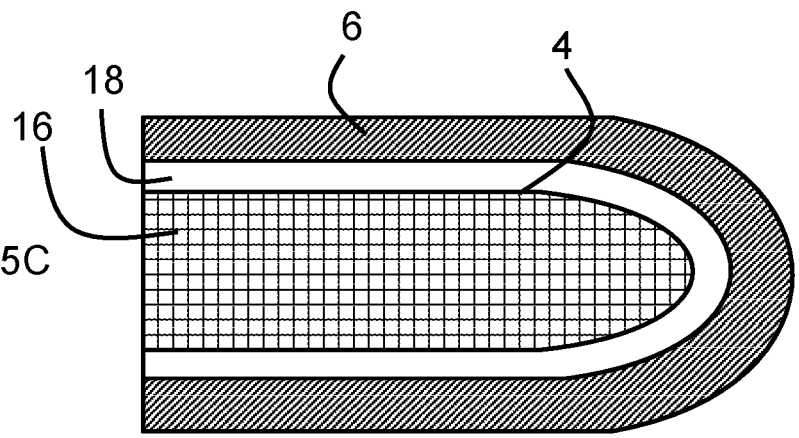

FIG. 5C After ramp-up to between 900° C. and 950° C., the protection oxide growth is in-situ in the range of 100 nm to 500 nm under wet atmosphere. The following in-situ annealing (between 0.5 and 4 hours) under a $N_2$ or Ar atmosphere depends on the necessary precipitate diameter to be stable during epitaxy ramp-up to 1100° C. and 1st epitaxy layer growth.

Figure 5D:
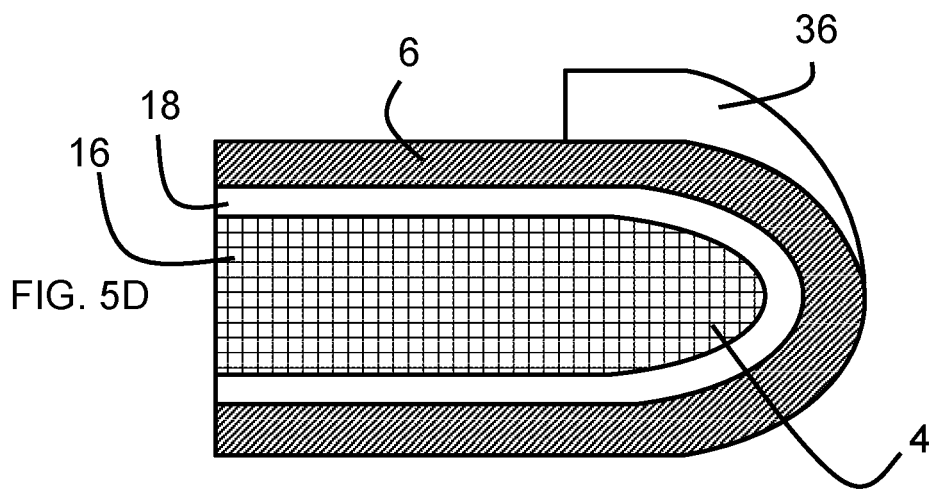

FIG. 5D The lithography step (similar to one used for positive resist as illustrated in FIG. 4) is performed to coat the oxide layer 6 at the edge 8 with resist 36.

Figure 5E:
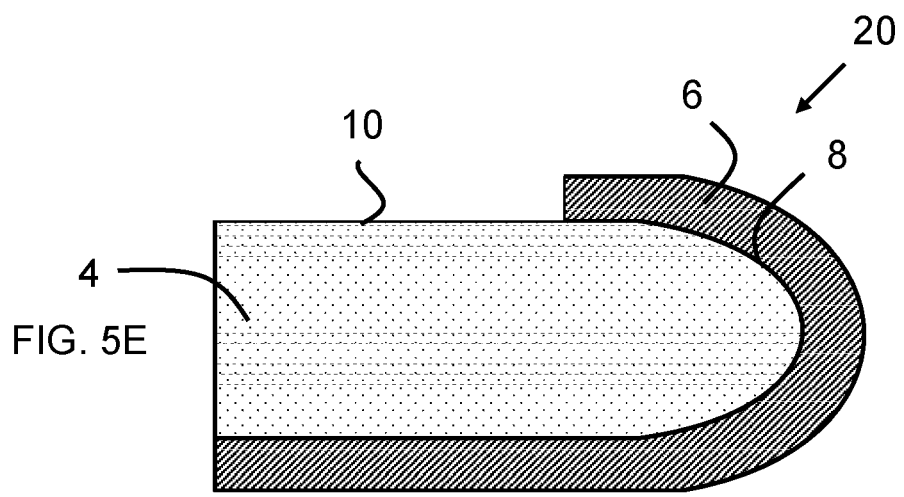

FIG. 5E An oxide etch at the central region 10 of the substrate 4 is performed, followed by resist removal and cleaning to complete the process.

Figure 6:
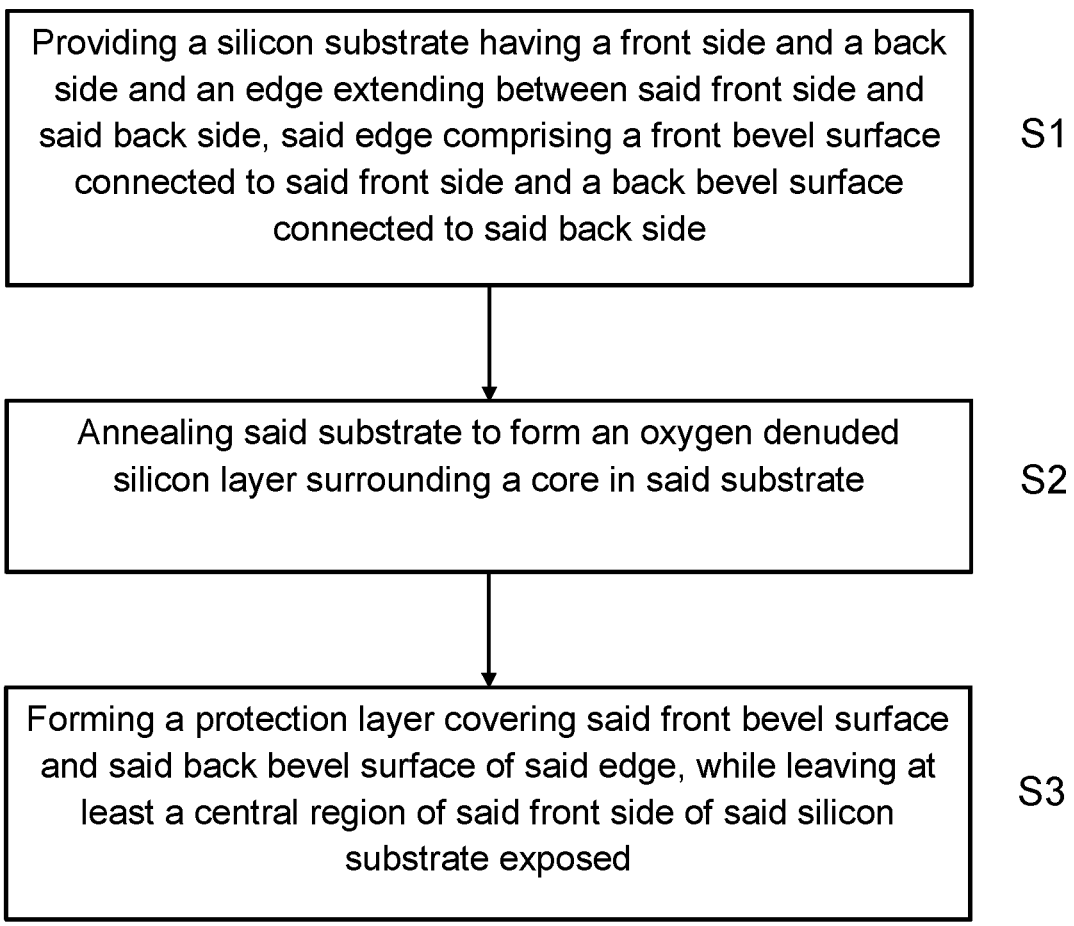
FIG. 6 is a flow diagram illustrating the steps of a method of preparing a wafer according to an embodiment.

FIG. 6 is a flow diagram illustrating the steps of a method of preparing a wafer according to an embodiment. The method may be used with either positive or negative resist. To aid understanding, reference numerals given in the method below refer back to the edge portion of a wafer shown in FIG. 2, but the method is not limited to the wafer of FIG. 2. The method comprises providing a silicon substrate 4 having a front side 12 and a back side 14 and an edge 8 extending between said front side 12 and said back side 14, said edge 8 comprising a front bevel surface 22 connected to said front side 12 and a back bevel surface 24 connected to said back side 14 (step 51), annealing said substrate 4 to form an oxygen denuded silicon layer 18 surrounding a core 16 in said substrate 4 (step S2), and forming a protection layer 6 covering said front bevel surface 22 and said back bevel surface 24 of said edge 8, while leaving at least a central region 10 of said front side 12 of said silicon substrate 4 exposed (step S3).

The step S2 of annealing the substrate may be a first of several steps of annealing during the wafer preparation. The step may comprise annealing at a temperature of 1000° C. for a period of time such that said oxygen denuded silicon layer has a thickness in the range of 10 μm to 30 μm, or in the range 5 μm to 50 μm. After annealing the substrate 4

(step S2), the temperature may be reduced (ramp-down) to between 600° C. and 800° C. to form precipitation seeds in the core of the substrate.

If a positive resist is used, step S3 of the illustrated method may comprise performing a first oxidation to form a first oxide layer (e.g. 10 nm to 60 nm thick), forming a silicon nitride, SiN, hard mask on said first oxide layer, wherein said hard mask covers said central region and does not cover said front bevel surface, performing a second oxidation to form a second oxide layer (e.g. 100 nm to 600 nm thick) being said protection layer, wherein said second oxide layer is grown on the substrate in regions not covered by said hard mask, removing said hard mask from said first oxide layer in said central region, and performing an oxide etch to remove said first oxide layer from said central region. The step of forming said SiN hard mask may comprise, depositing a SiN layer on said first oxide layer, coating said SiN layer with a resist, developing said resist, and performing a SiN etch to remove said SiN layer from an area not covered by said resist.

If a negative resist is used, step S3 of the illustrated method may comprise providing an oxide layer (e.g. 100 nm to 600 nm thick) covering said substrate, coating said oxide layer with a resist, developing said resist, and performing an oxide etch to remove said oxide layer from said substrate in an area not covered by said resist to expose said central region. Using a negative resist requires only one oxidation step and no SiN hard mask. However, negative resist is not always available.

Some advantages of the described embodiments include:
Improved bevel protection using processes available in the standard CMOS foundry environment.
The process can be applied to any kind of Si wafer (regardless of thickness, doping, diameter, etc.)
The process does not require any mask and lithography stepper tool.
All bevel surfaces (back and front bevel surfaces) and the Si wafer back surface is protected.
The EPI ready Si surface is formed with an oxygen denuded Si layer (up to between 10 μm and 20 μm depth), which provides better substrate surface quality control during the initial GaN on Si EPI steps.
The mechanical properties of the wafer remain substantially unchanged after the process.

In general, the present disclosure provides a wafer suitable for epitaxial growth of gallium nitride (GaN) in a Metal Oxide Chemical Vapor Deposition (MOCVD) process, and methods of manufacturing such. The wafer comprises a silicon substrate having a front side and a back side and an edge extending between said front side and said back side, said edge comprising a front bevel surface connected to said front side and a back bevel surface connected to said back side, wherein said silicon substrate comprises an oxygen denuded silicon layer surrounding a core, and a protection layer being a thermally grown silicon oxide ($SiO_2$) layer substantially covering said front bevel surface and said back bevel surface of said edge, while leaving at least a central region of said front side of said silicon substrate exposed, for preventing meltback during said MOCVD process.

The protection layer may also cover said back side of said silicon substrate, such that only said central region is exposed. The wafer may further comprise a group-III nitride layer covering said central region. The group-III nitride layer can comprise one of aluminium nitride, AN, indium nitride, InN, gallium nitride, GaN, aluminium gallium nitride, AlGaN, indium aluminium nitride, InAlN, and indium aluminium gallium nitride, InAlGaN, or is formed from a stack of layers formed from any combination of these materials. The protection layer may have a thickness greater than 100 nm, or in the range of 100 nm to 1000 nm, or in the range of 200 nm to 600 nm.

The oxygen denuded silicon layer may have a thickness in the range of 5 μm to 50 μm. The core may have a precipitation size in the range of 2 nm to 20 nm.

The wafer may further comprise a silicon nitride, SiN, layer covering said back side of said silicon substrate. The SiN layer may cover said back bevel surface.

While specific embodiments of the invention have been described above, it will be appreciated that the invention as defined by the claims may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. A method of preparing a wafer suitable for epitaxial growth of gallium nitride in a Metal Oxide Chemical vapor Deposition (MOCVD) process, said method comprising:
providing a silicon substrate having a front side and a back side and an edge extending between said front side and said back side, said edge comprising a front bevel surface connected to said front side and a back bevel surface connected to said back side;
forming a protection layer covering said front bevel surface and said back bevel surface of said edge, while leaving at least a central region of said front side of said silicon substrate exposed, wherein said forming comprises:
performing a first oxidation and annealing of said silicon substrate to form a first oxide layer and to generate an oxygen denuded silicon layer surrounding a core in said silicon substrate, wherein said annealing comprises annealing at a temperature of 800 to 1,200° C. for a period of time such that said oxygen denuded silicon layer has a thickness in the range of 10 μm to 30 μm;
after said first oxidation and annealing, reducing the temperature to between 600° C. and 800° C. to form precipitation seeds in said core of said silicon substrate;
forming a silicon nitride mask on said first oxide layer, wherein said silicon nitride mask covers said central region and does not cover said front bevel surface;
after said reducing the temperature, performing a second oxidation of said silicon substrate to form a second oxide layer being said protection layer and to grow said precipitation seeds by increasing the temperature, wherein said second oxide layer is grown on said silicon substrate in regions not covered by said silicon nitride mask;
removing said silicon nitride mask from said first oxide layer in said central region; and
performing an oxide etch to remove said first oxide layer from said central region.

2. The method according to claim 1, wherein said step of forming said protection layer comprises forming said protection layer such that it also covers said back side of said silicon substrate.

3. The method according to claim 1, wherein said step of forming said silicon nitride mask comprises:
   depositing a SiN layer on said first oxide layer;
   coating said SiN layer with a resist;
   developing said resist; and
   performing a SiN etch to remove said SiN layer from an area not covered by said resist.

4. The method according to claim 1, wherein said step of performing said second oxidation comprises growing said second oxide layer to have a thickness in a range of 100 nm to 1000 nm.

5. The method according to claim 1, wherein said step of removing said silicon nitride mask comprises performing a SiN etch down to said first oxide layer.

6. The method according to claim 1, wherein said step of performing an oxide etch comprises a diluted hydrofluoric acid, HF, or buffered HF oxide etch step.

7. The method according to claim 1, wherein said method is performed in a standard Complementary Metal Oxide Semiconductor, CMOS, process.

\* \* \* \* \*